United States Patent
Mui et al.

(10) Patent No.: US 7,544,556 B1
(45) Date of Patent: Jun. 9, 2009

(54) PROCESS FOR FORMING CMOS DEVICES USING REMOVABLE SPACERS

(75) Inventors: Ken Mui, Portland, OR (US); Aaron Marmorstein, Atlanta, GA (US); Eric Lee, Corvallis, OR (US)

(73) Assignee: Integrated Device Technology, Inc., San Jose, CA (US)

( * ) Notice: Subject to any disclaimer, the term of this patent is extended or adjusted under 35 U.S.C. 154(b) by 431 days.

(21) Appl. No.: 10/986,636

(22) Filed: Nov. 12, 2004

(51) Int. Cl.
*H01L 21/8238* (2006.01)
(52) U.S. Cl. .................. 438/199; 438/230; 438/585; 438/305
(58) Field of Classification Search .................. 438/199, 438/230, 305, 585
See application file for complete search history.

(56) References Cited

U.S. PATENT DOCUMENTS

| | | | |
|---|---|---|---|
| 5,714,413 A | 2/1998 | Brigham et al. | |
| 5,770,508 A | 6/1998 | Yeh et al. | |
| 6,107,130 A * | 8/2000 | Fulford et al. | ............... 438/231 |
| 6,156,598 A | 12/2000 | Zhou et al. | |
| 6,294,480 B1 | 9/2001 | Pradeep et al. | |
| 2006/0019456 A1 * | 1/2006 | Bu et al. | ..................... 438/303 |

* cited by examiner

*Primary Examiner*—Jack Chen
(74) *Attorney, Agent, or Firm*—Kenneth Glass; Glass & Associates

(57) ABSTRACT

A process for forming CMOS devices is disclosed in which disposable spacers are used to obtain a structure having improved gap-fill characteristics. First, gate film stacks are formed on the substrate. A shallow implant process is performed so as to form shallow source/drain implant regions. A layer of oxide and a layer of silicon nitride are deposited and etched to form a first set of spacers that extend on opposite sides of the gate film stacks. A second implant is performed so as to form intermediate source/drain implant regions. A set of disposable spacers are then formed that extend on opposite sides of each of the gate film stacks. A third implant process is performed so as to form deep source/drain implant regions. The disposable spacers are then removed, providing more space for the subsequently-formed contact to land.

8 Claims, 9 Drawing Sheets

PROCESS FOR FORMING CMOS DEVICES USING REMOVABLE SPACERS

FIELD OF THE INVENTION

The present invention relates to the field of semiconductor devices. More particularly, the present invention relates to Complimentary Metal-Oxide Semiconductor (CMOS) manufacturing processes.

BACKGROUND ART

In sub-micron Complimentary Metal-Oxide Semiconductor (CMOS) manufacturing, disposable dielectric spacers are sometimes used to define the heavily doped contact region of a source/drain structure. In conventional processes that use disposable dielectric spacers, a first implant is performed prior to forming the first spacer. This first implant forms lightly-doped drain ($L_{DD}$) regions. The L-shaped permanent spacer and the disposable spacer are then formed, with the disposable spacer overlying the L-shaped spacer. A second implant process is then performed so as to form the heavily doped contact region. The disposable spacer is then removed, leaving the L-shaped spacer. This process works well when there is sufficient space between adjacent gate structures. However, in applications where the spacing between adjacent gate structures is less than 0.2 microns, the vertical or nearly-vertical slope of the L-shaped spacer causes voids to form during deposition of the pre-metal dielectric layer. These voids in the pre-metal dielectric layer can lead to bridging defects in the subsequently formed contacts. In addition, the width of conventional L-shaped spacers takes up valuable space on the semiconductor surface, limiting size reduction of closely-spaced CMOS structures.

Accordingly there is a need for a process for forming a CMOS device that gives good gap-fill characteristics between adjacent gate structures. Also, there is a need for CMOS devices that do not have bridging defects. The present invention meets the above needs.

DISCLOSURE OF THE INVENTION

A process for forming Complimentary Metal Oxide Semiconductor (CMOS) devices is disclosed in which disposable spacers are used to obtain a structure having improved gap-fill characteristics. First, gate film stacks are formed on the substrate. A shallow implant process is then performed so as to form shallow source/drain implant regions. A layer of oxide and a layer of silicon nitride are deposited and etched to form a first set of spacers that extend on opposite sides of the gate film stacks. A second implant is then performed so as to form intermediate source/drain implant regions. A set of disposable spacers are then formed that extend on opposite sides of each of the gate film stacks. A third implant process is then performed so as to form deep source/drain implant regions adjoining each of the disposable spacers. The disposable spacers are then removed.

The resulting structure has sidewalls that are disposed at an angle greater than ninety degrees relative to the substrate. This sloped profile gives better gap-fill characteristics than prior art processes in which L-shaped spacers are used that have vertical sidewalls. Thereby, fewer voids are formed in the dielectric film, reducing the occurrence of bridging defects.

In the present embodiment, the first set of spacers have a slope that is approximately triangular, and a width that is less than the width of L-shaped spacers that are used in prior art CMOS processes that utilize disposable spacers. Accordingly, once the disposable spacers are removed, there is more available space between adjacent gate film stacks, allowing for locating gate film stacks closer together than is possible in conventional prior art processes in which wider L-shaped spacers are used.

These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and together with the description, serve to explain the principles of the invention.

The drawings referred to in this description should be understood as not being drawn to scale.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
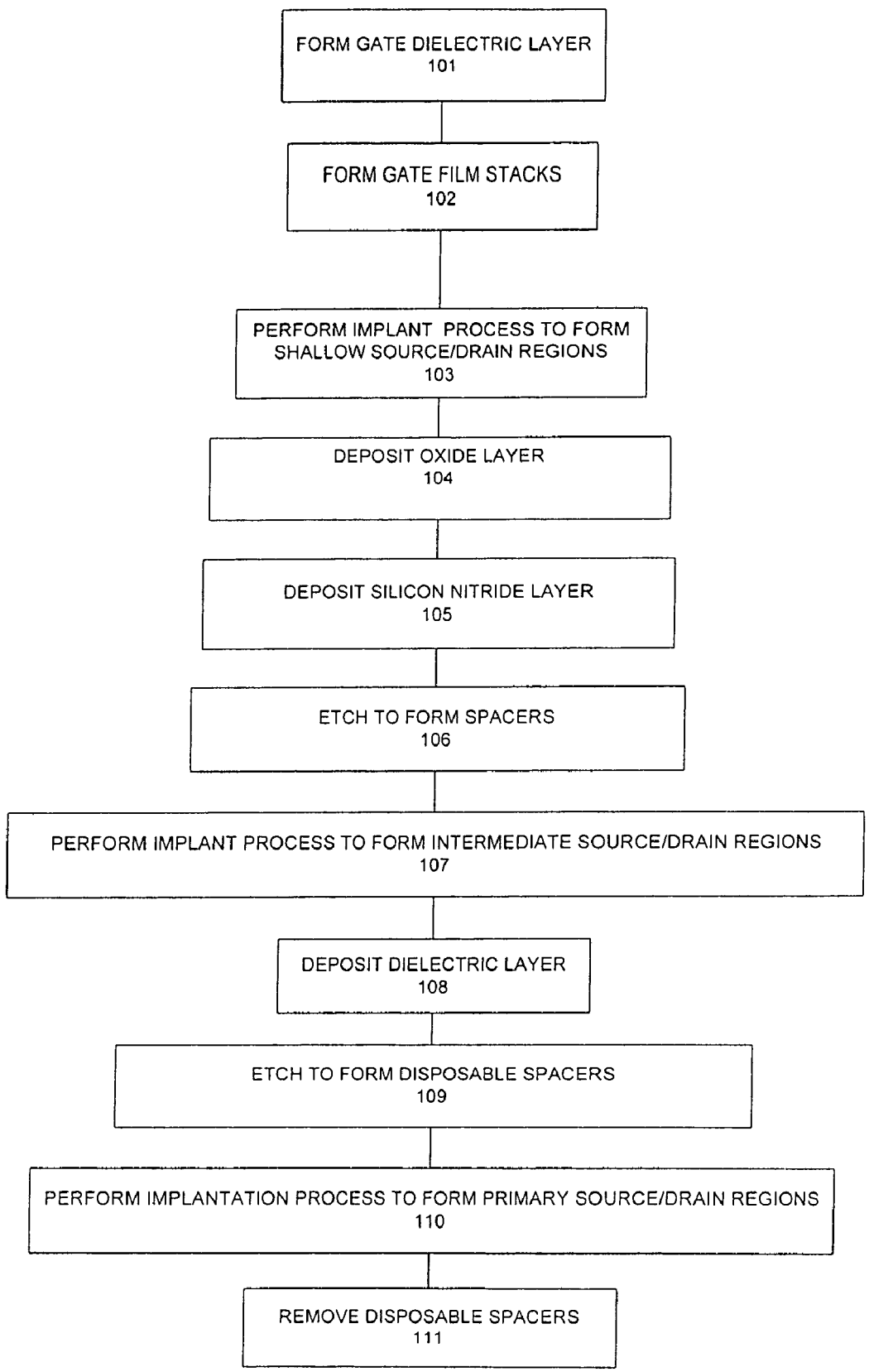
FIG. 1 illustrates a process for forming a CMOS device using removable spacers in accordance with an embodiment of the present invention.

FIG. 1 illustrates a process for forming a CMOS structure using disposable spacers. First, as shown by step 101 a gate dielectric layer is formed over a semiconductor substrate. The gate dielectric layer can be formed by depositing or growing a thin layer (e.g., 10 to 80 Angstroms) of silicon dioxide ($SiO_2$), or other type of dielectric, on the semiconductor substrate.

Referring now to step 102, gate film stacks are formed over the gate dielectric layer. In the present embodiment, adjacent gate film stacks are formed that include a hard mask and one or more underlying layers. In the present embodiment gate film stacks are formed that have a width of 1,400 Angstroms or less and have side surfaces that are approximately vertical. In this embodiment gate film stacks are identical and are closely spaced together, with adjacent gate film stacks separated by a distance of 2,000 Angstroms or less.

Figure 2:
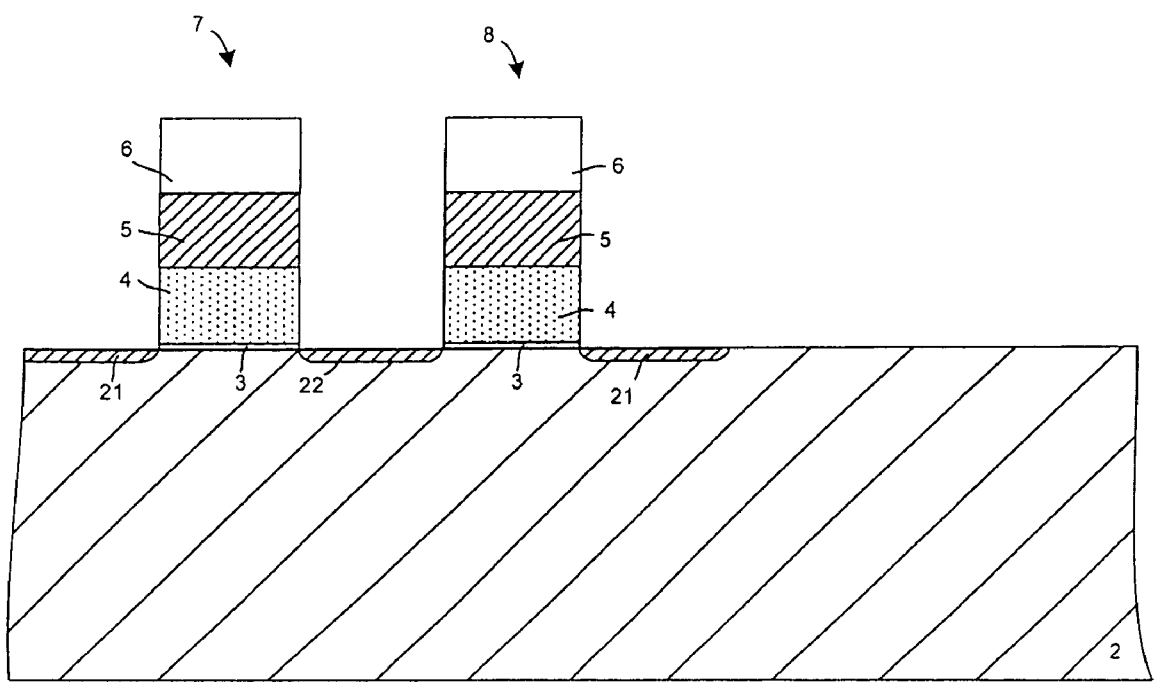
FIG. 2 shows a semiconductor substrate over which a dielectric layer and two gate film stacks have been formed, after a first implant has been performed so as to form shallow source/drain regions in accordance with an embodiment of the present invention.
Figure 3:
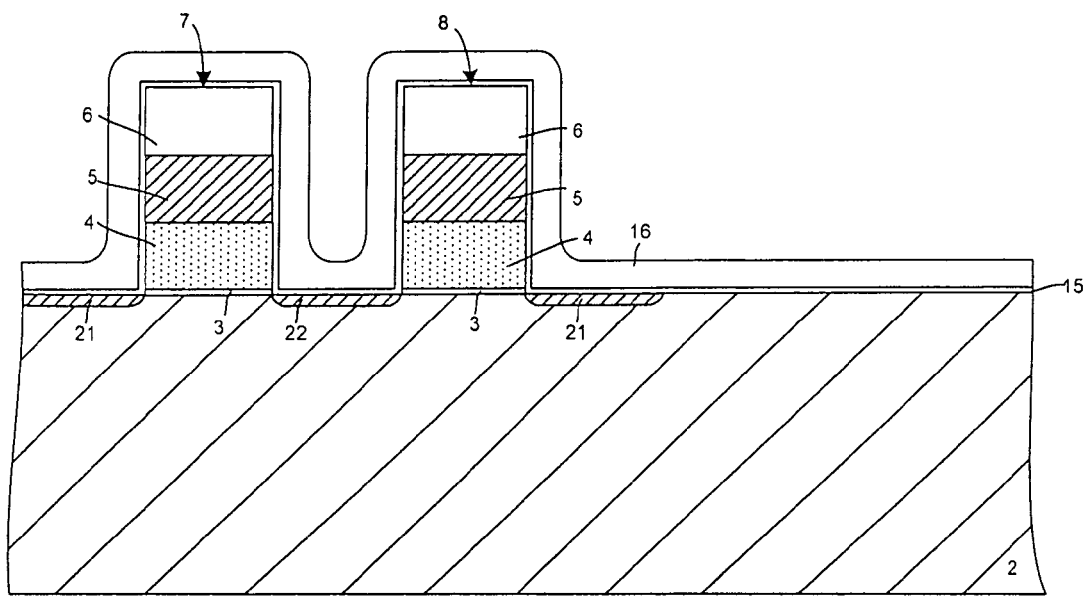
FIG. 3 shows the structure of FIG. 2 after a layer of oxide and a layer of silicon nitride have been deposited over the semiconductor substrate in accordance with an embodiment of the present invention.
Figure 4:
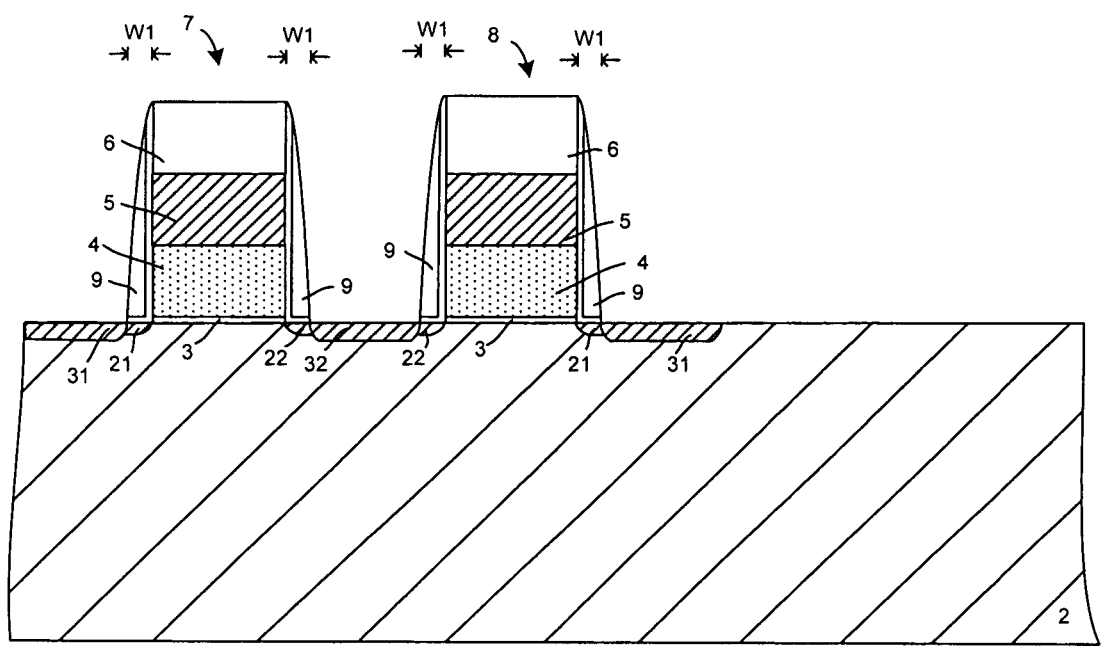
FIG. 4 shows the structure of FIG. 3 after an etch process has been performed so as to remove portions of the oxide layer and the silicon nitride layer to form a first set of spacers, and after an implant process has been performed so as to form intermediate source/drain regions in accordance with an embodiment of the present invention.
Figure 5:
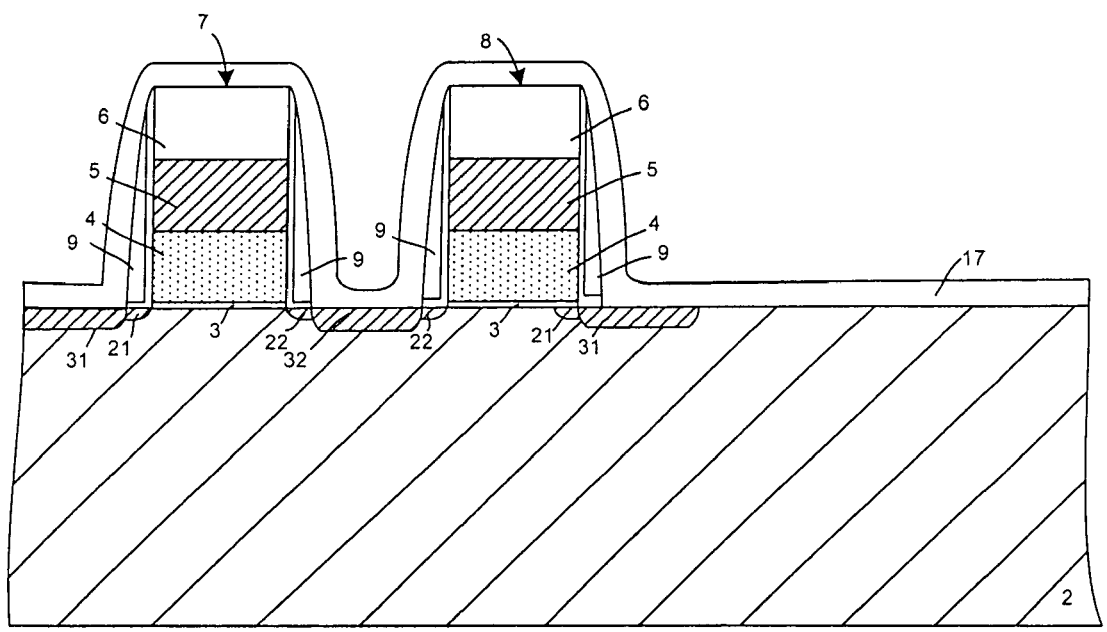
FIG. 5 shows the structure of FIG. 4 after a dielectric layer has been deposited thereover in accordance with an embodiment of the present invention.

Referring now to FIG. 2, exemplary gate film stacks 7-8 are shown to be formed that immediately overlie gate dielectric layer 3. Patterning of gate film stacks 7-8 also removes portions of gate dielectric layer 3 so as to expose portions of semiconductor substrate 2. Semiconductor substrate 2 can include isolation regions (e.g., using shallow trench isolation processing steps) or other device isolation structures, depending on the device requirements.

Gate film stacks 7-8 include a conductive layer 4, a silicide layer 5, and a hard mask 6. Conductive layer 4 includes one or more layers of conductive material that immediately overlie gate dielectric layer 3. In one embodiment conductive layer 4 has a thickness of 500 to 2,000 Angstroms. Conductive layer 4 can be formed by depositing one or more layers of polysilicon using a chemical vapor deposition process. Alternatively, conductive layer 4 can be formed by depositing amorphous silicon in a furnace. In the present embodiment conductive layer 4 is a single layer of polysilicon that is deposited using a chemical vapor deposition process, and that has a thickness of approximately 650 Angstroms.

Continuing with FIG. 2, silicide layer 5 can be formed of one or more layers of refractory metal silicide, with individual layers formed of cobalt silicide, tungsten silicide, titanium silicide, tantalum silicide, molybdeum silicide, niobium silicide, rhenium silicide, vanadium silicide, chromium silicide, zirconium silicide or hafnium silicide. Silicide layer can also be formed using non-refractory-metal silicides, or non-metal silicides that have sufficient conductivity. In one embodiment silicide layer 5 is deposited using a Chemical Vapor Deposition (CVD) process and has a thickness of 600 to 1,000 Angstroms. In the present embodiment silicide layer 5 is a single layer of tungsten silicide ($WSi_x$), that directly overlies conductive layer 4, and that has a thickness of approximately 650 Angstroms.

Hard mask 6 extends immediately over silicide layer 5 and can be formed of one or more layers of dielectric material. In one embodiment hard mask 6 is formed of a single layer of oxide ($SiO_2$), silicon nitride (SiN) or oxynitride ($SiO_xN_y$) that has a thickness of 500 to 2,500 Angstroms. Alternatively, hard mask 6 can include multiple layers of material, with individual layers formed of oxide, silicon nitride or oxynitride.

Also, hard mask 6 can be formed using other dielectric materials that can be preferentially etched relative to silicide layer 5. In the present embodiment hard mask 6 is a single layer of silicon nitride having a thickness of approximately 2,125 Angstroms.

As shown by step 103 of FIG. 1, an implant process is performed so as to form shallow source/drain implant regions. In the present embodiment a masking structure is formed using photoresist that exposes portions of the substrate that are to be doped and an implant is performed so as to introduce impurities into the substrate. In the embodiment shown in FIG. 2, implant step 103 forms source and drain implant regions 21-22. In the present embodiment implant process 103 is performed using a low doping concentration and at a low energy level such that source/drain implant regions 21-22 are shallow and are lightly doped. In the embodiment shown in FIG. 2, region 22 is a common source/drain implant region that extends between gate film stacks 7-8. However, alternatively, implant region 22 can include two separate and distinct source and/or drain implant regions.

A first set of spacers are formed as shown by steps 104-106 of FIG. 1. First, as shown by step 104, an oxide layer is deposited. In the embodiment shown in FIGS. 3-9, an oxide layer 15 is deposited over semiconductor substrate 2 using a Plasma Enhanced Chemical Vapor Deposition (PECVD) process such that oxide layer 15 immediately overlies gate film stacks 7-8. In the present embodiment oxide layer 15 is a single layer of tetraethylorthosilicate (TEOS). However, oxide layer 15 can also Undoped Silica Glass (USG).

A layer of silicon nitride (SiN), or other dielectric that can be selectively etched relative to oxide, is then deposited over the semiconductor substrate as shown by step 105. In the present embodiment silicon nitride layer 16 is deposited using a Low Pressure Chemical Vapor Deposition (LPCVD) process such that silicon nitride layer 16 immediately overlies oxide layer 15. In one embodiment oxide layer 15 has a thickness of 50 to 200 Angstroms and silicon nitride layer 16 has a thickness of 50 to 300 Angstroms.

In one specific embodiment oxide layer 15 has a thickness of approximately 200 Angstroms and silicon nitride layer 16 has a thickness of approximately 300 Angstroms. However, it is appreciated that the thickness of the oxide layer and the overlying silicon nitride layer will vary depending on the requirements of the particular fabrication process and the geometries and spacing of gate film stacks 7-8.

Referring now to step 106, an etch process is performed so as to form a first set of spacers. In the embodiment shown in FIG. 4, the etch process of step 106 is a reactive ion etch that removes portions of layers 15-16, forming spacers 9 that extend on opposite sides of each of gate film stacks 7-8 and immediately adjoin gate film stacks 7-8. Spacers 9 have a shape that is approximately triangular, and extend laterally a width W1 that is less than the width of conventional L-shaped spacers that are used in conventional prior art fabrication processes. In the present embodiment, the width W1 of spacers 9 extends less than 400 angstroms. The reduced width W1 of spacers 9 and the roughly triangular shape of spacers 9 can be obtained by tuning the power and timing of the reactive ion etch process. In one embodiment the reduced width W1 and the roughly triangular shape of spacers 9 is obtained by using a high power setting and performing etch 106 for a short period of time.

As shown by step 107, a second implant process is performed so as to form intermediate source/drain implant regions. In the present embodiment a masking structure is formed using photoresist that exposes portions of the substrate that are to be doped and an implant is performed so as to introduce impurities into the substrate. In the embodiment shown in FIG. 4, implant step 107 forms source and drain implant regions 31-32. In the present embodiment implant process 107 is performed using a doping concentration that is higher than the doping concentration of step 103 and is performed at a higher energy level than the energy level used in step 103, producing source/drain implant regions 31-32 having a depth that is greater than the depth of source/drain implant regions 21-22, and a doping concentration that is greater than the doping concentration of source/drain implant regions 21-22. In the present embodiment region 32 is a common source/drain implant region that extends between gate film stacks 7-8. However, alternatively, source/drain implant region 32 could include two separate and distinct source and/or drain implant regions. The boundaries of source/drain implant regions 31-32 nearest gate film stacks 7-8 are defined by spacers 9. More particularly, since spacers 9 extend a distance W1 from the sides of gate film stacks 7-8, the boundaries of source/drain implant regions 31-32 nearest gate film stacks 7-8 will also extend approximately a width W1 from the sides of gate film stacks 7-8.

As shown by step 108 a dielectric layer is deposited. In the embodiment shown in FIG. 5, a dielectric layer 17 is deposited over semiconductor substrate 2 such that it immediately overlies portions of gate film stacks 7-8 and spacers 9. In one embodiment dielectric layer 17 is a single layer of oxide that is deposited using a Plasma Enhanced Chemical Vapor Deposition (PECVD) process. In the present embodiment dielectric layer 17 is a single layer of phosphosilicate glass (PSG). However, dielectric layer 17 can also be doped oxide, borophosphosilica glass (BPSG), undoped silica glass (USG), borosilica glass (BSG) or other dielectric material that can be etched at a high etch rate. In addition, dielectric layer 17 can include multiple layers of material, with individual layers formed of doped oxide, BPSG, USG, BSG, PSG or oxynitride. In one embodiment dielectric layer 17 has a thickness of from 50 to 400 Angstroms.

Referring now to step 109 an etch process is performed so as to form a second set of spacers. In the present embodiment the etch process of step 109 is a reactive ion etch that removes portions of dielectric layer 17, forming disposable spacers 10 that immediately adjoin spacers 9 and that extend on opposite sides of gate film stacks 7-8.

Figure 6:
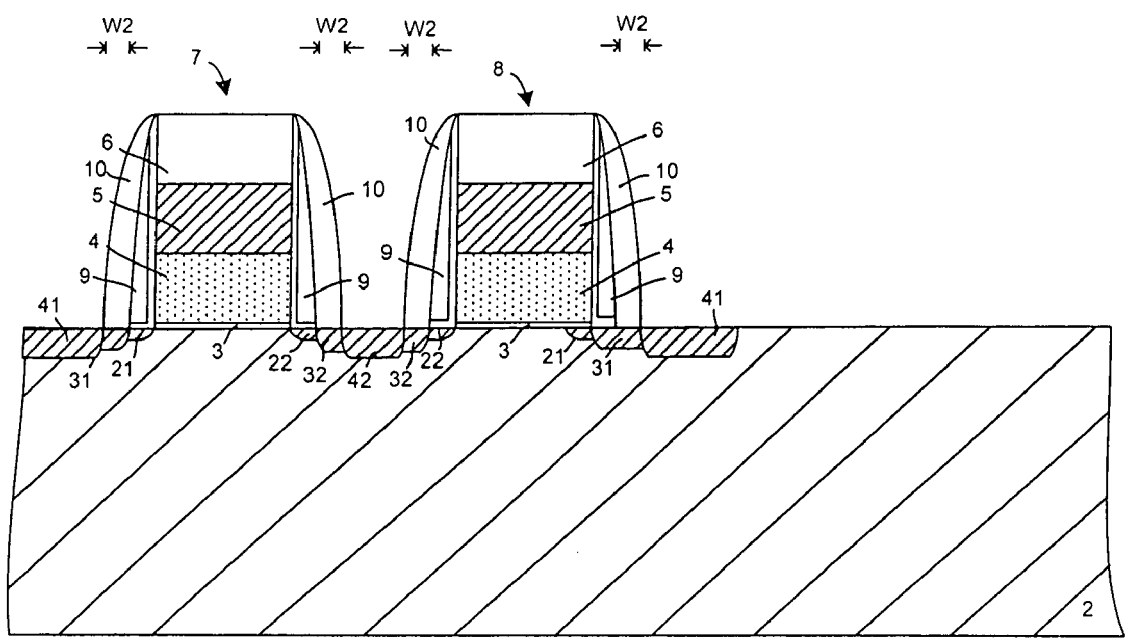
FIG. 6 shows the structure of FIG. 5 after an etch process has been performed to selectively remove a portion of the dielectric layer, forming dielectric spacers that extend on each side of each gate film stack and after an implant process has been performed so as to form primary source/drain regions in accordance with an embodiment of the present invention.
Figure 7:
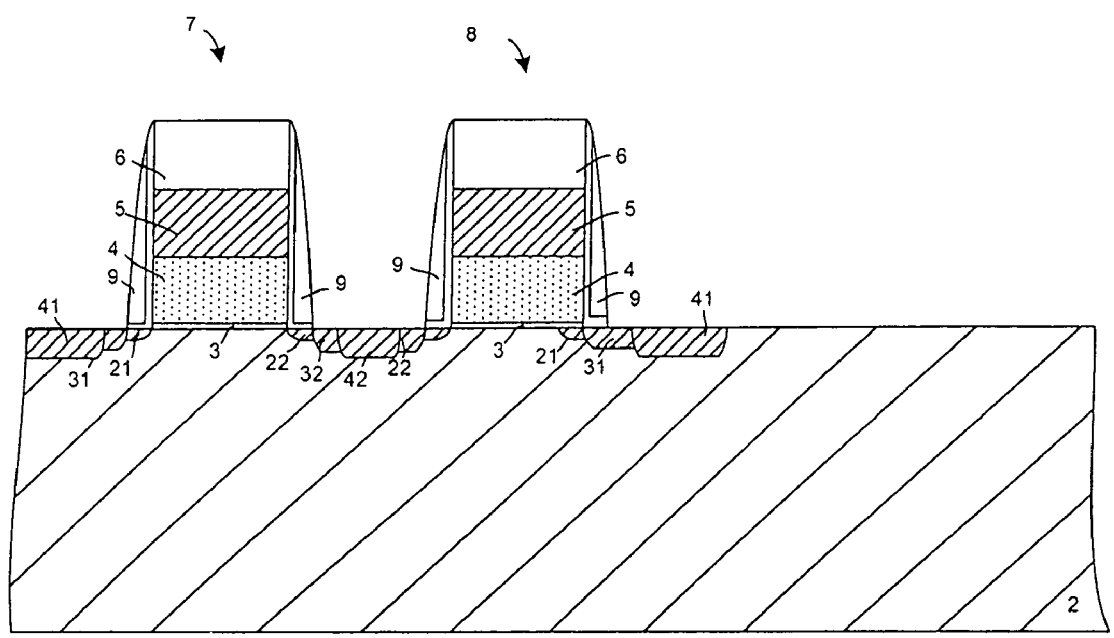
FIG. 7 shows the structure of FIG. 6 after removal of the disposable spacers in accordance with an embodiment of the present invention.

Referring now to FIG. 6, disposable spacers 10 have a width at their base that is shown as width W2. In one embodiment, dielectric layer 17 has a thickness prior to etch (step 109) of 400 Angstroms, forming spacers 9 having a thickness W2 of approximately 300 Angstroms. However, it is appreciated that the width W2 will vary depending on the thickness of dielectric layer 17 prior to etch, and the deposition process that is used.

Referring now to step 110 an implant process is performed so as to form primary source/drain regions. In the present embodiment a masking structure is formed using photoresist that exposes portions of the substrate that are to be doped and an implant is performed so as to introduce impurities into the substrate. In the embodiment shown in FIG. 6, implant step 110 forms primary source and drain implant regions 41-42. In the present embodiment implant process 110 is performed using a high doping concentration and at a high energy level such that source/drain implant regions 41-42 are deep and are heavily doped. Accordingly, the doping concentration and depth of source/drain implants 41-42 will be greater than the doping concentration and depth of both source/drain implant regions 21-22 and 31-32.

The boundaries of source/drain implant regions 41-42 nearest gate film stacks 7-8 are defined by disposable spacers 10. More particularly, since spacers 10 extend a distance W2 from the sides of gate film stacks 7-8, the boundaries of source/drain implant regions 41-42 nearest gate film stacks 7-8 will also extend approximately a width W2 from the sides of gate film stacks 7-8. In the present embodiment source/drain implant region 42 is a common source/drain implant region that extends between gate film stacks 7-8. However, alternatively, source/drain implant region 42 could include two separate and distinct source and/or drain regions.

FIG. 6 shows the completed source/drain regions formed by steps 101-110 of the present invention that includes shallow source/drain implant regions 21-22, intermediate source/drain implant regions 31-32 and primary source/drain implant regions 41-42. Shallow source/drain implant regions 21-22 extend from each side of gate film stacks 7-8, and have a shallow depth relative to the depth of intermediate source/drain implant regions 31-32 and primary source/drain implant regions 41-42. Primary source/drain implant regions 41-42 adjoin intermediate source/drain implant regions 31-32 and have a deep depth, with the depth of primary source/drain implant regions 41-42 being greater than the depth of shallow source/drain implant regions 21-22 and intermediate source/drain implant regions 31-32. Intermediate source/drain implant regions 31-32 extend between shallow source/drain implant regions 21-22 and primary source/drain implant regions 41-42, and have an intermediate-depth relative to the depth of shallow source/drain regions 21-22 and primary source/drain regions 41-42. More particularly, the depth of intermediate source/drain implant regions 31-32 will be greater than the depth of shallow source/drain implant regions 21-22 and will be less than the depth of primary source/drain implant regions 41-42. The use of intermediate source drain implant regions 31-32 reduces the likelihood of charge tunneling, while not compromising drive current by having an unnecessarily high resistive region adjacent to the transistor channel.

The depth and doping concentrations of shallow source/drain implant regions 21-22, intermediate source/drain implant regions 31-32 and primary source/drain implant regions 41-42 will vary depending on the desired characteristics of the CMOS devices to be formed. However, in one exemplary embodiment of the present invention, NMOS devices are formed that include N− source/drain implant regions 21-22 that have a depth of from 0.1 to 0.2 microns, N− source/drain implant regions 31-32 that have a depth of from 0.15 to 0.25 microns, and N+ source/drain implants 41-42 that have a depth of from 0.25 to 0.5 micron. Also, PMOS devices can be formed having similar source/drain implant regions.

The disposable spacers are removed as shown by step 111. In the present embodiment, a wet etch is used to remove the disposable spacers. In the embodiment shown in FIGS. 6-7 a hydrofluoric acid is used to remove disposable spacers 10, giving the structure shown in FIG. 7. It can be seen that step 111 removes all of disposable spacers 10 so as to expose that portion of semiconductor substrate 2 in which intermediate source/drain implant regions 31-32 are formed.

In one embodiment an anneal process is performed so as to extend source/drain implant regions 21-22, 31-32 and 41-42. The anneal process can be performed by heating semiconductor substrate 2 in a furnace and can be performed either before or after step 111. Alternatively, an anneal process can be performed later in the CMOS fabrication process.

Figure 8:
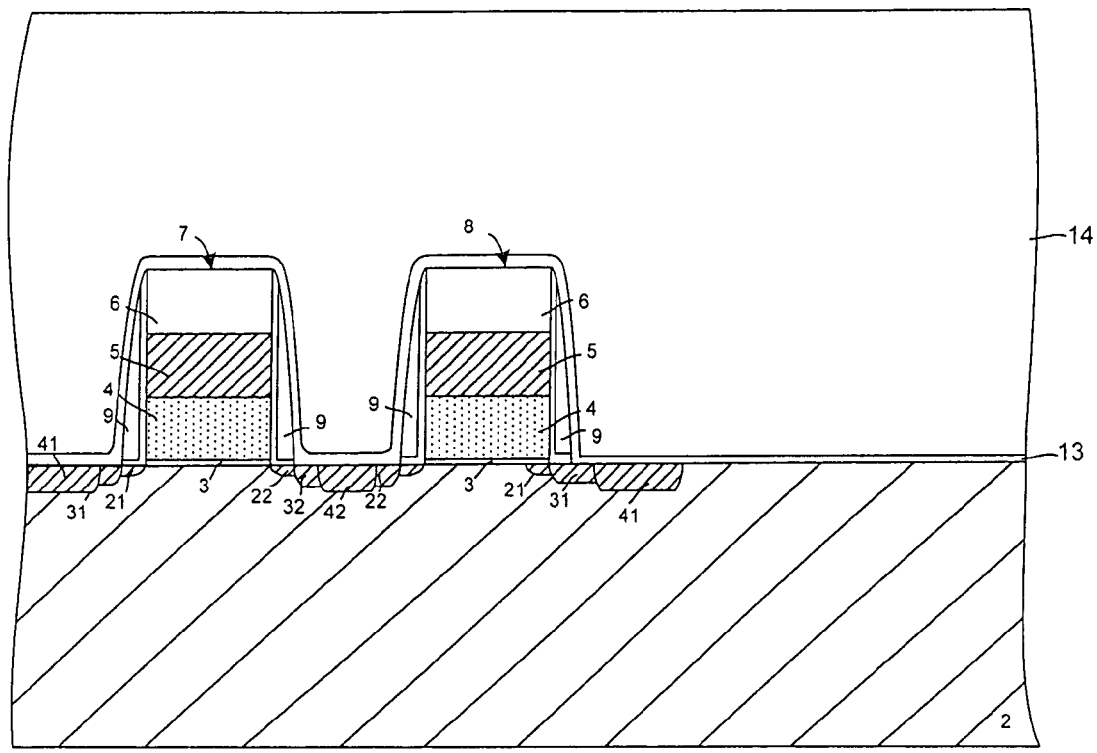
FIG. 8 shows the structure of FIG. 7 after a barrier layer has been deposited and after a pre-metal dielectric film has been formed in accordance with an embodiment of the present invention.

Referring now to the structure shown in FIG. 8, the process of FIGS. 1-8 forms a CMOS structure that has good gap-fill characteristics. More particularly, the sides of spacers 9 that extend between gate film stacks 7-8 extend at an angle that is greater than ninety degrees relative to the top surface of semiconductor substrate 2. This sloped profile gives better gap-fill characteristics than prior art processes in which L-shaped spacers are used that have vertical sidewalls. Thereby, fewer voids are formed in the subsequently-formed dielectric film, reducing the occurrence of bridging defects. Moreover, since the width of spacers 9 (W1) is less the width of conventional L-shaped spacers that are used in prior art CMOS processes that utilize disposable spacers, gate film stacks can be formed closer together than is allowed by conventional prior art processes in which L-shaped spacers are used.

Figure 9:
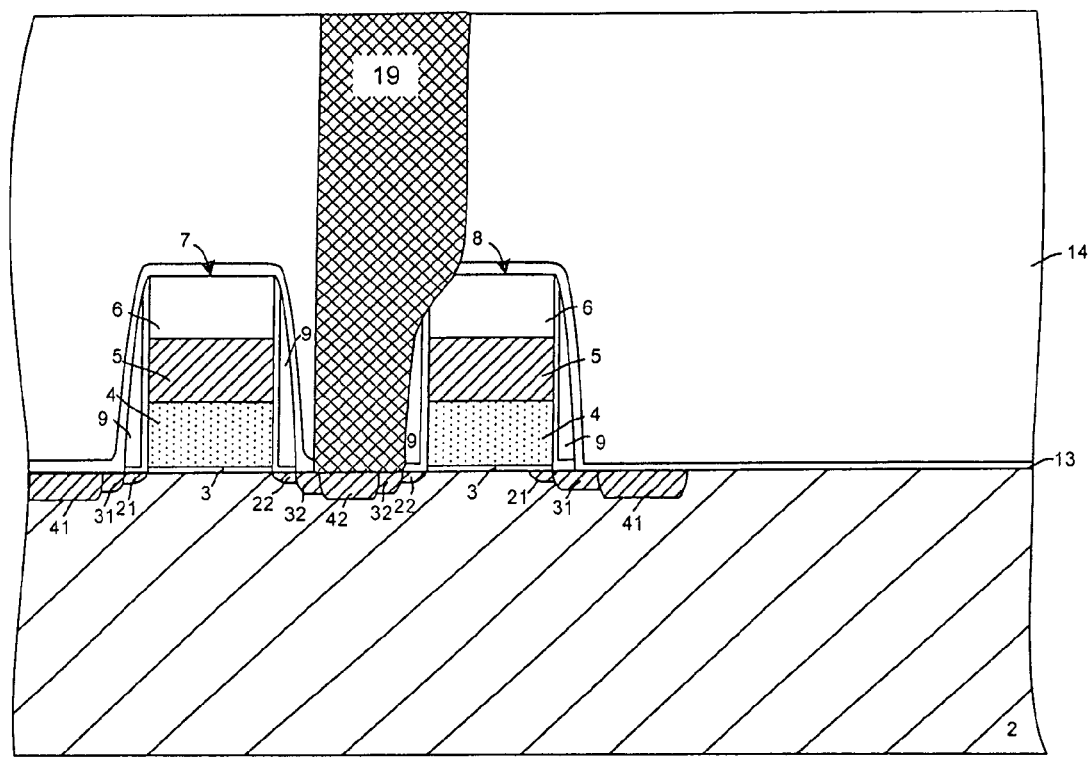
FIG. 9 shows the structure of FIG. 8 after a self-aligned contact has been formed that extends through the pre-metal dielectric film, the barrier layer, and the gate dielectric layer in accordance with an embodiment of the present invention.

In one embodiment that is illustrated in FIGS. 8-9, a self-aligned contact structure is formed that connects source drain implant region 42 to overlying circuitry. In this embodiment a barrier layer 13 is deposited over semiconductor substrate 2. The term "barrier layer," as used in the present application, includes any layer of dielectric material that can act as an etch stop relative to the material in pre-metal dielectric film 14, and specifically includes silicon nitride, silicon oxide, and silicon oxynitride. Barrier layer 13 can be one or more layers of dielectric material, with each layer formed of silicon nitride, silicon oxide, silicon oxynitride, or other dielectric material that can act as an etch stop relative to the material in pre-metal dielectric film 14. In the present embodiment, barrier layer 13 is formed by depositing a single layer of silicon nitride, having a thickness of approximately 200 Angstroms.

A pre-metal dielectric film 14 is then formed. In the present embodiment, dielectric film 14 extends over the entire semiconductor substrate and has a thickness such that it extends from 1,000 to 15,000 Angstroms over the top of gate film stacks 7-8. Pre-metal dielectric film 14 can be one or more layers of dielectric material, with each layer formed of doped oxide, borophosphosilica glass (BPSG), undoped silica glass (USG), spin on glass (SOG), borosilica glass (BSG), phosphosilicate glass (PSG) or tetraethylorthosilicate (TEOS), oxynitride or other dielectric material that can be selectively etched relative to the material in barrier layer 13.

A selective etch process is then performed to form self-aligned contact openings that are then filled with conductive material to form self-aligned contacts. In the present embodiment a two-step etch process is used to form self-aligned contact openings. The first etch process is a selective etch that etches through pre-metal dielectric film 14 and stops on barrier layer 13. In the present embodiment this first etch uses fluorine based chemistry (e.g., $C_4F_8$, $C_5F_8$, $C_2HF_5$) that is tuned to obtain a high etch rate of oxide (pre-metal dielectric layer 14) and a low etch rate of silicon nitride (barrier layer 13, hard mask 6 and spacer 9). A second selective etch process is then used to extend the opening through barrier layer 13 and gate dielectric layer 3. The second etch can be a highly selective dry etch that preferentially etches barrier layer 13 while minimally etching pre-metal dielectric film 14. In one embodiment, a dry etch is used (for example, a dry etch that uses $CHF_3$ and $O_2$, $CH_3F$) that is tuned to obtain a high etch rate of silicon nitride and a low etch rate of oxide so as to remove the exposed portion of barrier layer 13, while only minimally removing material from pre-metal dielectric film 14. The etch process for forming self-aligned contact openings preferentially etches the material in pre-metal dielectric film 14 over the material in spacer 9 and barrier layer 13, aligning the self-aligned contact opening with the region of semiconductor substrate 2 that extends between gate film stack 7 and gate film stack 8 such that contact 19 is a self-aligned contact.

The self-aligned contact openings are then filled with conductive material (e.g., metal or metal alloy) that is then planarized using a chemical mechanical polishing process so as to form self-aligned contact 19 shown in FIG. 9. Self-aligned contact 19 connects to primary source/drain implant region 42. The heavy doping of primary source/drain implant region 42 ensures good ohmic contact with self-aligned contact 19.

The preferred embodiment of the present invention is thus described. While the present invention has been described in particular embodiments, it should be appreciated that the present invention should not be construed as limited by such embodiments, but rather construed according to the following claims.

What is claimed is:

1. A process for forming a CMOS device comprising:
   selectively implanting impurities into a semiconductor substrate so as to form shallow implant regions that extend on opposite sides of a gate film stack;
   forming a first set of spacers over the semiconductor substrate such that the first set of spacers extend on opposite sides of the gate film stack, the first set of spacers having a shape that is approximately triangular;
   selectively implanting impurities into the semiconductor substrate so as to form intermediate implant regions on opposite sides of the gate film stack;
   forming a second set of spacers over the semiconductor substrate, the second set of spacers partially covering the intermediate implant regions;
   selectively implanting impurities into the semiconductor substrate so as to form deep implant regions;
   removing the second set of spacers;
   forming a barrier layer immediately over the first set of spacers after the removing the second set of spacers;
   forming a dielectric film that extends over the barrier layer; and
   forming a self aligned contact that extends through the dielectric film and the barrier layer so as to contact one of the deep implant regions.

2. The process of claim 1 wherein the first set of spacers are formed by depositing a layer of oxide and a layer of silicon nitride, and performing a reactive ion etch process so as to remove portions of the layer of oxide and the layer of silicon nitride.

3. The process of claim 2 wherein the layer of oxide comprises a layer of tetraethylorthosilicate (TEOS) that is deposited using a Plasma Enhanced Chemical Vapor Deposition (PECVD) process.

4. The process of claim 2 wherein the second set of spacers comprise oxide.

5. The process of claim 4 wherein the second set of spacers are formed by depositing a layer of oxide and performing a reactive ion etch process so as to remove portions of the layer of oxide.

6. The process of claim 1 wherein the intermediate implant regions have a depth that is greater than the depth of the shallow implant regions and have a depth that is less than the depth of the deep implant regions.

7. The process of claim 6 wherein the shallow implant regions have a light doping concentration and the deep implant regions have a heavy doping concentration, the intermediate implant regions having a doping concentration that is greater than the doping concentration of the shallow implant regions and having a doping concentration that is less than the doping concentration of the deep implant regions.

8. The process of claim 1 wherein the first set of spacers are formed by depositing a layer of oxide over the gate film stack, depositing a dielectric layer immediately over the layer of oxide and performing a reactive ion etch process so as to remove portions of the layer of oxide and the dielectric layer.

* * * * *